United States Patent
Colandene

(10) Patent No.: US 7,042,646 B2
(45) Date of Patent: May 9, 2006

(54) INFRARED DEVICE HAVING AN OPTICAL POWER LIMITER WITH IMPROVED OPTICAL GAIN

(75) Inventor: Thomas M. Colandene, Springfield, VA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 11/031,000

(22) Filed: Jan. 10, 2005

(65) Prior Publication Data

US 2005/0139754 A1    Jun. 30, 2005

Related U.S. Application Data

(63) Continuation-in-part of application No. 09/888,509, filed on Jun. 26, 2001, now abandoned.

(51) Int. Cl.
    *G02B 27/10*    (2006.01)
(52) U.S. Cl. .................. 359/626; 359/355; 359/619; 359/620; 359/621
(58) Field of Classification Search ................ 359/355, 359/620, 626, 356, 619, 621; 250/338.1
    See application file for complete search history.

(56) References Cited

U.S. PATENT DOCUMENTS

| 5,351,151 A | * | 9/1994 | Levy ........................... 359/240 |
| 2004/0188617 A1 | * | 9/2004 | Devitt et al. ............. 250/338.1 |

* cited by examiner

*Primary Examiner*—Joseph P. Martinez
(74) *Attorney, Agent, or Firm*—Arthur K. Samora

(57) ABSTRACT

An infrared device in accordance with the present invention includes an optical train for receiving incident radiation into the device, a focal plane array for receiving the incident radiation from the optical train, and an optical power limiter (OPL) that is positioned therebetween. To improve the overall optical gain for the device, the optical train initially focuses the incident radiation into an intermediate focal plane that is located within the OPL. With this configuration, however, the incident radiation begins to lose focus once it passes through the intermediate focal plane and exits the OPL. To prevent this, the infrared device includes a plurality of microlenses on the OPL surface that is facing the focal plane array. The plurality of microlenses re-focuses the incident radiation onto a final focal plane that is coincident with the focal plane array.

4 Claims, 1 Drawing Sheet

INFRARED DEVICE HAVING AN OPTICAL POWER LIMITER WITH IMPROVED OPTICAL GAIN

This application is a Continuation-In-Part and claims the benefit of the filing date Jun. 26, 2001 of U.S. patent application Ser. No. 09/888,509 now abandoned by Thomas Colandene, entitled "Off-Focal Plane Micro-Optics".

GOVERNMENT INTEREST

The invention described herein may be manufactured, used, sold, imported, and/or licensed by or for the Government of the United States of America.

FIELD OF THE INVENTION

The present invention applies generally to optical imaging devices. More particularly, the present invention is useful as an IR imaging device with an optical power limiter that protects the device against harmful incident radiation, while simultaneously having an improved optical gain for the device.

BACKGROUND OF THE INVENTION

Infrared (IR) staring sensors are well known in the prior art for obtaining data in the IR spectrum. Typically, IR sensors include an optical train for receiving incident radiation. The optical train receives the optical rays through an aperture, and then directs the incoming IR optical rays onto a focal plane array (FPA) for further processing and display by other components of the device.

Because the FPA (by design) is very sensitive to changes in light intensity, however, one of the disadvantages of these devices is that during operation, the device is vulnerable to light radiation sources of extreme intensity, such as laser sources. A laser beam could damage the FPA if it illuminated the FPA directly, so it is extremely desirable that the vulnerability of the IR device be minimized to this type of radiation.

To minimize this vulnerability, various optical systems make use of, or could make use of, components known as optical power limiters (OPL). OPL's are made of materials which minimize laser damage to the focal plane array by blocking passage of the laser energy, but allowing passage of scene radiation through the OPL.

The placement of OPL's in an infrared sensor, however, does have disadvantages, in that there is a loss of optical gain for the device. That is, IR radiation loses focus slightly as it passes through the OPL. Thus, the solution in the prior art was to place the OPL as close to the focal plane array as possible to minimize the loss in optical gain for the device.

In view of the above, it is therefore one object of the invention to provide an infrared device, having an OPL with improved optical gain for the device. It is another object of the present invention to provide an infrared device with an OPL wherein incident radiation is focused into an intermediate focal plane that is located within the OPL. Yet another object of the present invention is to provide an IR device with an OPL, wherein the OPL has integral structure that re-focuses incident radiation passing therethrough from an intermediate focal plane onto a final focal plane that is co-planar with the focal plane array. Another object of the present invention is to provide an infrared device with an OPL that is easy to manufacture in a cost-efficient manner.

SUMMARY OF THE INVENTION

An infrared device having an improved optical gain in accordance with the present invention includes an optical train for receiving incident radiation therein, and a focal plane array for receiving the incident radiation from the optical train. The focal plane array contains an array of detector elements, which allow for further processing of the incident radiation into an image format. The device of the present invention further includes an optical power limiter (OPL) that is positioned between the focal plane array and the optical train. The OPL prevents excess radiant energy (such as that from a laser source) that may enter the device through the optical train from damaging the detector elements of the focal plane array.

To improve the overall optical gain for the device, the optical train initially focuses the incident radiation into an intermediate focal plane that that is located within the OPL. With this configuration, however, the incident radiation begins to lose focus once it passes through the intermediate focal plane and exits the OPL. Thus, the device in accordance with the present invention has a means for re-focusing the incident radiation that has passed through the intermediate focal plane and is leaving the OPL. Preferably, the re-focusing means comprises a plurality of microlenses that are formed integral to the OPL on the OPL surface facing the focal plane array. Preferably, the OPL is made from an Indium-Antimonide (InSb) material, which facilitates the forming of the aforementioned microlenses on the OPL surface.

The plurality of microlenses re-focuses the incident radiation onto a final focal plane that is coincident with the focal plane array. In the preferred embodiment of the invention, each microlens corresponds to a respective detector element of the focal plane array.

For the methods of the present invention, the OPL is positioned on the optical axis between the optical train and the focal plane array. The optical train focuses incident radiation onto an intermediate focal plane that is co-planar with the OPL. The method further comprises the step of re-focusing the incident radiation as it passes therethrough. The re-focusing step is accomplished with a plurality of microlenses that re-focus the radiation onto a focal plane that is coincident with the focal plane array.

BRIEF DESCRIPTION OF THE DRAWINGS

The novel features of this invention will be best understood from the accompanying drawings, taken in conjunction with the accompanying description, in which similar characters refer to similar parts, and in which.

WRITTEN DESCRIPTION OF THE PREFERRED EMBODIMENT

Figure 1:
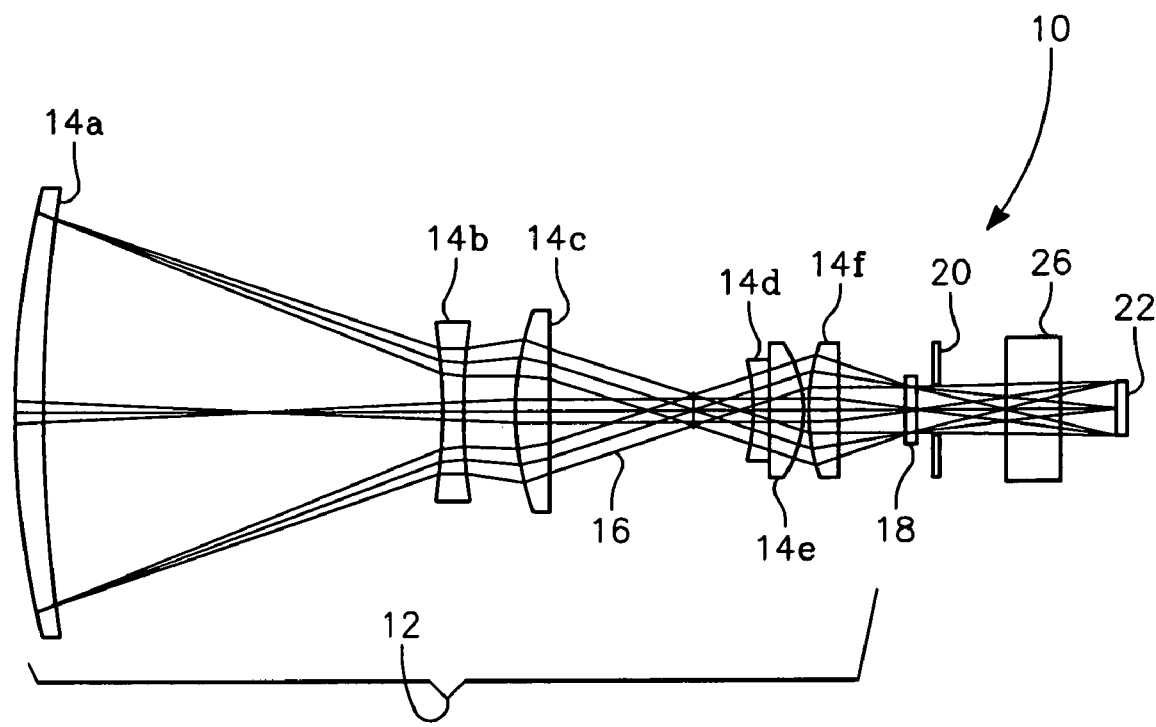
FIG. 1 is a schematic view of an infrared sensor device of the present invention, along with an optical ray-trace of incident radiation.
Figure 2:
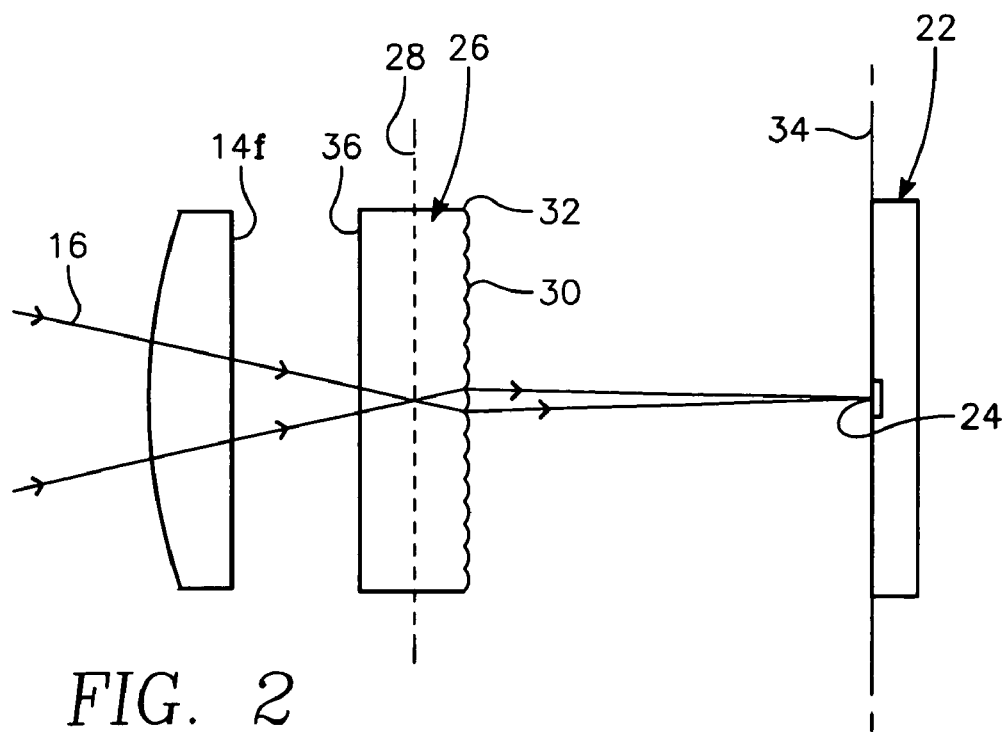
FIG. 2 is an enlarged side-elevation view of the device of FIG. 1 with the Dewar window and cold stop removed for clarity, which shows the structure and operation of the optical power limiter in greater detail.

Referring now to the FIG. 1, a typical infrared (IR) staring sensor device is shown and designated by reference character 10. As shown in FIG. 1, the device includes an optical train 12 that comprises a plurality of lenses 14a–14f. The lenses 14 focus and re-direct incoming optical ray bundles 16 of IR radiation through a Dewar window 18. After passing through Dewar window 18, the optical ray bundles pass through the sensor pupil/cold stop 20, and they are then directed onto a focal plane array (FPA) 22. As the incoming optical ray bundles 16 impinge on the FPA, a plurality of detector elements or pixels 24 (a representative pixel 24 is shown in FIG. 2) receive the IR data from the ray trace. After the FPA receives the IR data, other components of the sensor convert the data in the optical ray bundles into an IR image in a manner known in the art.

Before reaching the FPA, however, the optical rays pass through an optical power limiter (OPL) 26 that is located along the line-of-sight of the device between the optical train 12 and the focal plane array 22. The OPL has structure and is made of a material which allows for passage of IR radiation therethrough. At the same time, the OPL prevents the passage of high intensity light (such as a laser beam) from passing therethrough. Thus, the OPL prevents certain types of high-intensity light from shining directly on the FPA, as high-intensity light would damage the sensitive detector elements.

One of the disadvantages of OPL's, however, is that they tend to refract the IR radiation passing therethrough. To correct this loss of focus, and referring now to FIG. 2, the structure of the IR device can be modified. Specifically, the optical power limiter is positioned spaced-apart from the optical train 12 so that the optical train focuses incident radiation onto an intermediate focal plane 28 that is coincident with the OPL. Stated differently, the optical train 12 focuses incident radiation into an intermediate focal plane 28 that is located within the OPL (as shown in FIG. 2).

As can be seen from the ray trace in FIG. 2, once the incident radiation passes through the OPL, it begins to refract. Accordingly, a re-focusing means is required to re-direct incident radiation onto the focal plane. For the present invention, the re-focusing means comprises a plurality of microlenses 30 that are formed integral to the optical power limiter, on a microlens surface 32 of the OPL that faces the FPA. To do this, the OPL is preferably made of an Indium-Antimonide (InSb) material. For clarity, a single ray trace 16 is shown leaving a single microlens 30 in FIG. 2. In the preferred embodiment, however, a plurality of microlenses 30 are formed in microlens surface 32 and arranged in an array, with each microlens 30 corresponding to a respective pixel 24 in FPA 22.

The microlenses re-focus the incident radiation as it leaves the OPL onto a final focal plane 34. The final focal plane is coincident with a plane containing the FPA pixels 24. In this manner, the OPL can provide improved protection for the FPA without a loss in focus of the image data. Stated differently, the structure of the OPL of the present invention, in addition to its power limiting function, provides for improved optical gain for the overall IR device 10.

While the IR sensor having an optical power limiter with improved gain of the present invention (as herein shown and disclosed in detail) is fully capable of obtaining the objects and providing the advantages above stated, it is to be understood that the presently preferred embodiments are merely illustrative of the invention. As such, no limitations are intended other than as defined in the appended claims.

What is claimed is:

1. An infrared device comprising:
   an optical train for receiving an incident radiation into said device;
   a focal plane array for receiving said incident radiation from said optical train;
   an optical power limiter having a first surface and an opposing second surface, said second surface facing said focal plane array;
   said optical power limiter being positioned between said optical train and said focal plane array, said optical train focusing said incident radiation into an intermediate focal plane located within said optical power limiter;
   a means for re-focusing incident radiation, having a plurality of microlenses integral to said optical power limiter and formed on said second surface, re-focuses said incident radiation from said intermediate focal plane onto a final focal plane that is coincident with said focal plane array;
   said focal plane array includes an array of detector elements; and
   each of said plurality of microlenses corresponds to a respective detector element.

2. An infrared device comprising:
   an optical train for receiving incident radiation into said device;
   a focal plane array for receiving said incident radiation from said optical train;
   an optical power limiter positioned between optical train and said focal plane array, said optical train focusing said incident radiation into an intermediate focal plane located within said optical power limiter;
   a means for re-focusing said incident radiation from said intermediate focal plane onto a final focal plane that is coincident with said focal plane array; and
   said optical power limiter is made from an Indium-Antimonide (InSb) material.

3. An infrared device comprising:
   an optical train for receiving incident radiation into said device;
   a focal plane array for receiving said incident radiation from said optical train, said focal plane array including a plurality of detector elements;
   at least one optical power limiter positioned between said optical train and said focal plane array, said optical train focusing said incident radiation into an intermediate focal plane located within said optical power limiter;
   said optical power limiter having a smooth surface and an opposing microlens surface, said microlens surface facing said focal plane array and being formed with a plurality of microlenses for re-focusing said incident radiation from said intermediate focal plane onto a final focal plane that is coincident with said focal plane array; and,
   each microlens corresponding to a respective detector element.

4. A method of improving the optical gain of an infrared device, while simultaneously protecting against high intensity laser radiation, comprising the steps of:
   affording an optical train for receiving incident radiation into said device;
   providing a focal plane array with a plurality of detector elements;
   placing an optical power limiter between said optical train and said focal plane array, said optical power limiter having a surface facing said focal plane array;
   focusing said incident radiation into an intermediate focal plane located within said optical power limiter; and
   forming a plurality of microlenses in said surface, each of said plurality of microlenses corresponding to a respective detector element, re-focuses said incident radiation from said intermediate focal plane onto a final focal plane that is coincident with said focal plane array.

* * * * *